United States Patent [19]

Elliott et al.

[11] Patent Number: 5,559,338
[45] Date of Patent: Sep. 24, 1996

[54] DEEP ULTRAVIOLET OPTICAL IMAGING SYSTEM FOR MICROLITHOGRAPHY AND/OR MICROFABRICATION

[75] Inventors: David J. Elliott, Wayland; Richard F. Hollman, Chelmsford, both of Mass.; David Shafer, Fairfield, Conn.

[73] Assignee: Excimer Laser Systems, Inc., Wayland, Mass.

[21] Appl. No.: 317,332

[22] Filed: Oct. 4, 1994

[51] Int. Cl.$^6$ .......................... B23K 26/00; H01L 21/268
[52] U.S. Cl. ..................... 250/492.1; 250/492.2
[58] Field of Search ............... 250/492.1, 492.2, 250/505.1; 359/366

[56] References Cited

U.S. PATENT DOCUMENTS

| | | | |
|---|---|---|---|
| 3,707,325 | 12/1972 | Hardeman et al. | 350/294 |
| 4,331,390 | 5/1982 | Shafer | 350/444 |
| 4,747,678 | 5/1988 | Shafer et al. . | |
| 4,749,840 | 6/1988 | Piwczyk | 219/121 LH |
| 4,953,960 | 9/1990 | Williamson . | |
| 4,980,563 | 12/1990 | George et al. | 250/492.2 |
| 5,031,976 | 7/1991 | Shafer . | |
| 5,031,977 | 7/1991 | Gibson . | |
| 5,071,240 | 12/1991 | Ichihara et al. | 359/366 |
| 5,089,913 | 2/1992 | Singh et al. | 359/727 |
| 5,161,059 | 11/1992 | Swanson et al. | 359/565 |
| 5,171,965 | 12/1992 | Suzuki et al. | 219/121.6 |
| 5,206,515 | 4/1993 | Elliott et al. . | |
| 5,212,593 | 5/1993 | Williamson et al. . | |
| 5,220,454 | 6/1993 | Ichihare et al. . | |
| 5,241,423 | 8/1993 | Chiu et al. . | |
| 5,251,070 | 10/1993 | Hashimoto et al. . | |

FOREIGN PATENT DOCUMENTS 42 03 464 A1   2/1992   Germany .

OTHER PUBLICATIONS

Bingham et al., "Principles of Aberration–Corrected Optical Systems", *SPIE*, vol. 654, (1985), pp. 88+93.

*Primary Examiner*—Bruce C. Anderson
*Attorney, Agent, or Firm*—Fish & Richardson P.C.

[57] ABSTRACT

A high resolution, deep UV beam delivery system for exposing a surface, directly or through a mask, for the purpose of photolithography, surface cleaning, microstructuring, pattern microimaging, surface modification or the like, the delivery system including a deep UV radiation source for generating a beam of narrow wavelength deep ultraviolet radiation along a path, a first optical system in the path for homogenizing and shaping the deep UV energy in the path; and a second optical system in the path for directing radiation energy onto the surface of a substrate to be processed, the second optical system including large area mirror structure having a numerical aperture of at least 0.3 and a modular compensation assembly of refractive elements disposed between said large area mirror structure and said substrate and corresponding to the wavelength of the radiation source for compensating (reducing) image curvature introduced into the system by the large area mirror structure.

19 Claims, 3 Drawing Sheets

DEEP ULTRAVIOLET OPTICAL IMAGING SYSTEM FOR MICROLITHOGRAPHY AND/OR MICROFABRICATION

This invention relates to high resolution deep ultraviolet systems for exposing material surfaces to a high energy deep ultraviolet radiation for purposes of photolithography, surface cleaning, microstructuring, microimaging of patterns and the like.

The processing of very high density integrated circuits requires high resolution systems capable of resolving and exposing portions of the circuit substrate, with the use of a mask in the optical path. In the process of making advanced integrated circuits, it is conventional to transfer a circuit pattern image from a mask or reticle onto a layer of photosensitive material called photoresist. The wavelengths used in optical lithography onto silicon wafers have gone from 436 nanometers (G line) to 365 nanometers (I line) using mercury lamp sources. Future wavelengths include 248 nanometers from a krypton fluoride excimer laser (or 250 nanometers from an intense mercury lamp), 213 nanometers from a solid state (5×xYAG) laser and 193 nanometers from an argon fluoride excimer laser. Systems for microimaging and microstructuring may use deep UV sources such as excimer lasers (150–250 nanometers).

In accordance with one aspect of the invention, there is provided a high resolution, deep UV beam delivery system for exposing a surface, directly or through a mask, for the purpose of photolithography, surface cleaning, microstructuring, pattern microimaging, surface modification or the like, the delivery system including a deep UV radiation source for generating a beam of deep ultraviolet radiation along a path, a first optical system in the path for homogenizing and shaping the deep UV energy in the path; and a second optical system in the path for directing radiation energy onto the surface of a substrate to be processed, the second optical system including large area mirror structure having a numerical aperture (N.A.) of at least 0.3 and a modular compensation assembly of refractive elements disposed between the large-area mirror structure and the substrate and corresponding to the wavelength of the radiation source for compensating (reducing) image curvature introduced into the system by the large area mirror structure.

Preferably, the deep UV radiation source is an excimer or other laser of wavelength in the 150–250 nanometer range (although it will be appreciated that other types of deep UV sources such as gas fill lamps and microwave energized sources may be employed in particular embodiments); the illumination optical system includes a binary optic plate with a first set of regions of normal transmission and a second set of regions where the UV radiation undergoes a 180° phase shift upon transmission. This binary optic plate transmits nearly one hundred percent of the incident radiation in a plurality of non-zero diffraction orders, i.e., essentially zero radiation is transmitted along the system axis. As a result, the radiation is delivered to the reticle with an angular distribution within the locus of acceptance angles of the imaging lens. The large area mirror structure includes a first mirror with a convex spherical surface that is disposed on the system axis and obscures a portion of the beam path, and a second mirror of concave spherical configuration with an aperture portion disposed on the system axis for passing a beam of radiation to the first mirror; and the binary illuminator is configured to deliver the radiation within the annular region provided by this large area mirror system. In a particular embodiment, the binary illuminator has first and second sets of triangular regions arranged in a hexagonal checkerboard pattern, but other geometric configurations and geometric region areas may be utilized in other particular embodiments.

In a preferred embodiment, the optical compensation module is removable and has a cluster of four refractive elements designed for a particular wavelength, for example, a first module for 193 nanometer excimer laser lithography, a second module for a 248 nanometer excimer laser lithography, and a third module for 266 nanometer lithography provided by a quadrupled YAG laser. Each module thus is dedicated to a particular wavelength corresponding to the wavelength of the radiation source that is utilized.

In lithography, the maximum fluence (energy per unit area per pulse) required for exposure is about one half joule per square centimeter while in micromachining the fluence required is generally dictated by the ablation threshold of the material being machined and typically is significantly greater than one half joule per square centimeter. The refractive elements of the compensation module are designed to maximize the transmission of the deep UV radiation beam, and preferably include less than six refractive elements that are all made of fused silica.

In a particular embodiment, the binary illuminator includes a diverging lens and a converging lens to provide a shaped collimated beam of radiation for application to a fused silica plate member that has an array of first and second patterns that are offset from one another by about 0.17 micron for use with a 193 nanometer radiation source and about 0.25 micron for use with use with a 248 nanometer radiation source. The plate member is about two millimeters thick and has a diameter of about thirty millimeters. Subsequent to the plate member is a condenser lens for focusing the radiation passed by the plate in an image plane at the entrance pupil of the mirror system.

The system provides a microlithography system with a numerical aperture of at least 0.3 with a pair of reflective elements and a group of refractive elements with substantial negative power (which flattens the field distorted by the two mirrors). The system preferably allows the operator to view the imaging process at a visible 633 nanometer wavelength while the substrate processing operative at a wavelength such as 193 nanometers or 248 nanometers is in progress.

In accordance with one aspect of the invention, the optical system relies principally on mirrors to transmit the integrated circuit pattern information from the mask or reticle to the photoresist coated silicon wafer or other substrate with refractive elements (all made of the same refractive material—(fused silica)) to compensate (preferably provide improvement of at least five times) for field curvature produced by these mirrors, as well as other aberrations introduced into the system. The invention provides improved performance in the form of a very flat field for microlithography, as well as giving a high numerical aperture (or fast speed of the lens) preferably in the range of 0.3 to 0.6 N.A. Correcting refractive elements close to the image include negative curvature power (preferably at least five times the curvature of the convex mirror) which flattens the field. The image formed by the two spherical mirrors thus is essentially completely flattened, just before it reaches the photoresist coated wafer where the aerial image is translated into a latent image in the photoresist coating. Having strong lens power near the image would normally cause substantial chromatic (or color) variations in aberrations, as well as both longitudinal chromatic focus shift (each change in wavelength or color would have a corresponding change in the location of focus of the image). In a particular embodiment, such aberrations are corrected and a broad deep ultraviolet spectral region can be imaged with diffraction-limited performance, by using only fused silica lenses. Normally, color correction is made by using two different types of glass such as flint glass and crown glass, each with different refraction characteristics. Another way to correct for color aberrations in the deep ultraviolet is to use calcium fluoride or magnesium fluoride lens elements. These types of glass have problems of poor homogeneity (material inconsistency), cannot be easily polished or fabricated (not hard enough) into high quality surfaces, and add complexity to the design by adding several additional optical elements. Color correction in the present invention is achieved in a particular embodiment by shaped refractive elements, and all the image correcting (refractive) elements are made of the same material (fused silica). The lenses which provide most of the field-flattening in the design are curved nearly concentric about the image, and the other lenses also are curved quite strongly towards the image, such that chromatic aberrations and variations of aberrations are well corrected.

Conventional deep-UV lenses are of the all-refractive type (no mirrors). They require that the light source be highly spectrally narrowed, down to less than one picometer. The result of this spectral narrowing is loss of 80 percent or more of the light energy. Such 'linenarrowed' laser exposure system, currently experimental for 248 nanometers and 193 nanometers lithography, have very low wafer exposure throughput, a key parameter in IC manufacturing economics. The mirror-based catadioptric embodiments of the invention allow for unnarrowed laser light, and use most of the available power.

Other features and advantages of the invention will be seen as the following description of a particular embodiment progresses, in conjunction with the dryings, in which.

DESCRIPTION OF PARTICULAR EMBODIMENT

Figure 1:
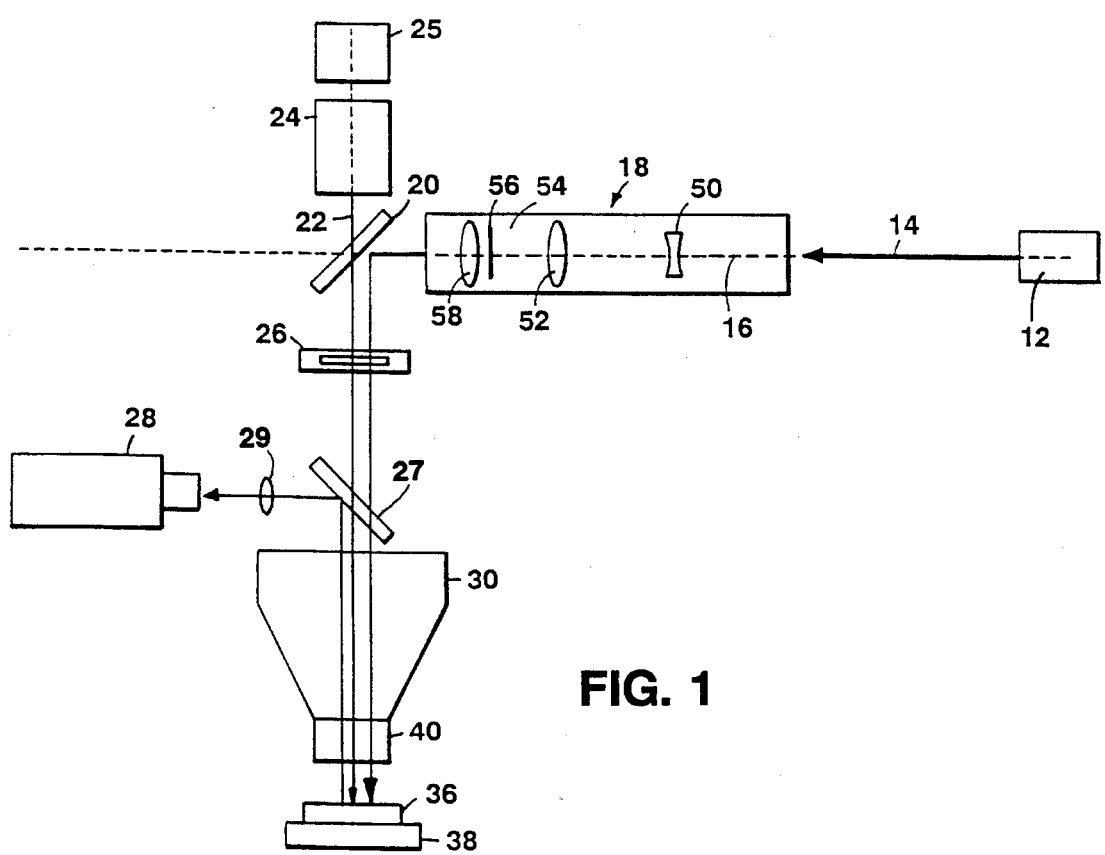
FIG. 1 is a diagram of a microlithography system in accordance with the invention.

With reference to FIG. 1, the system includes twenty watt argon fluoride excimer laser source 12 that generates deep UV (193 nanometer) radiation in a beam 14 along axis, or path, 16 for passage through binary illuminator optics, or module, 18 for impingement on beam splitter mirror 20.

Disposed along axis 22, that is orthogonal to axis 16, is a video camera or viewing port diagrammatically indicated at 28 illuminated by tungsten lamp 25 and condenser optics 24. The radiation on axis 16 is reflected by beam splitter mirror 20 for passage along beam axis 22 and through reticle or mask 26 having a pattern of lines of about one micron width.

Figure 2:
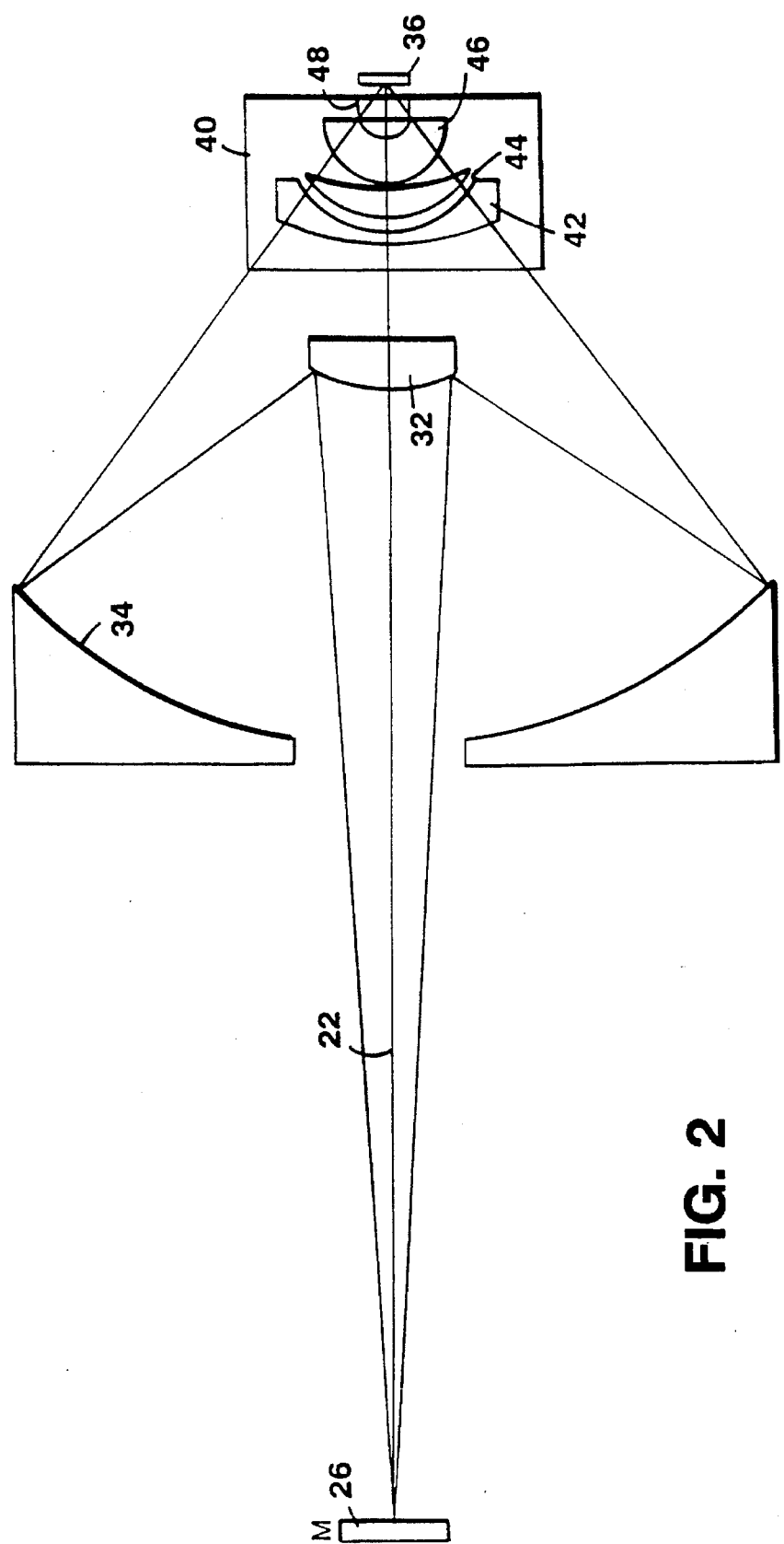
FIG. 2 is a diagram of imaging optics employed in the system shown in FIG. 1.

The deep UV radiation emerging from mask 26 passes through beam splitter 27 and through 10× reduction reflector system 30 that has a numerical aperture of 0.6 and includes (FIG. 2) central spherically convex obscuration mirror 32 and spherical concave annular mirror 34 for imaging a 10:1 optical reduction ratio or other optical reduction ratio such as 5:1 or 20:1 image of mask 26 on UV sensitive wafer target structure 36 that is supported on adjustable stage 38. Video camera 28 monitors the photolithography process, and optical correction lens 29 compensates for the focus shift change between the exposing radiation wavelength from laser 12 and the viewing radiation wavelength from tungsten lamp 25. That is, because the UV energy is in focus at the target structure 36 and the viewing energy is out of focus at the target structure 36, lens 29 is provided to, in effect, focus the camera 28 at the target structure 36.

Disposed between reflector system 30 and wafer target structure 36 is a refractive optics compensation module 40 that includes (FIG. 2) lenses 42, 44, 46, 48, each having leading surface A and trailing surface B, respectively (see table). In the embodiment shown in FIGS. 1 and 2, lenses 42 and 44 provide compensation for optical aberrations such as coma, astigmatism, chromatic variations; lens 46 provides field flattening compensation (flattens the curved field produced by mirrors 32 and 34) and lens 48 provides supplemental field flattening compensation.

The following table includes specific dimensional values of optical surfaces included in a particular embodiment:

| Surface | Radius (Millimeters) | Spacing (Millimeters) | Material |
|---|---|---|---|
| 32 | 44.18 | −98.48 | Reflector |
| 34 | 142.56 | 135.87 | Reflector |
| 42A | 69.21 | 4.86 | Fused Silica |
| 42B | 27.82 | 3.47 | Air |
| 44A | 28.40 | 9.00 | Fused Silica |
| 44B | 69.00 | 0.50 | Air |
| 46A | 17.00 | 12.66 | Fused Silica |
| 46B | 6.54 | 4.66 | Air |
| 48A | 208.12 | 6.39 | Fused Silica |
| 48B | −70.54 | 3.10 | Air |
| Wafer 36 | | | |

With reference to FIG. 1, the illuminator module 18 includes lenses 50 and 52, the incoming beam 14 in path 16 having a dimension of 7×20 millimeters from the laser source 12 and being passed through an aperture of seven millimeters diameter to provide a collimated beam of radiation that impinges on diverging lens 50 that expands the beam to about twenty-five millimeters diameter. Converging fused silica lens 52 provides collimated radiation in region 54 of about twenty-five millimeters diameter for impingement on binary optics plate 56 that has a thickness of about two millimeters and a diameter of about thirty millimeters. The binary optics plate 56 diffracts the collimated beam of radiation in region 54 for application to fused silica condenser lens 58 which focuses the beam of light at the entrance pupil of the mirror system after passage through the mask 26.

Figure 3:
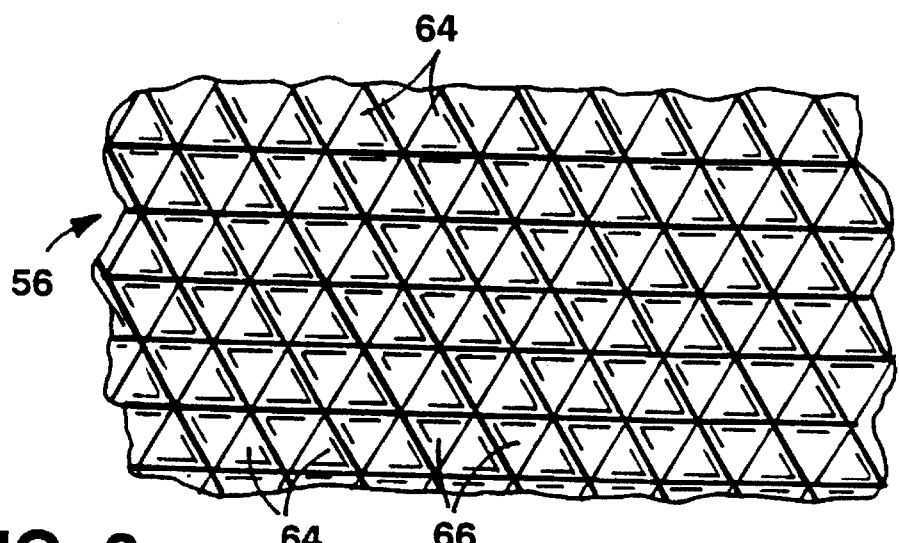
FIG. 3 is a diagrammatic view of a portion of the front surface of illumination plate 56.
Figure 4:
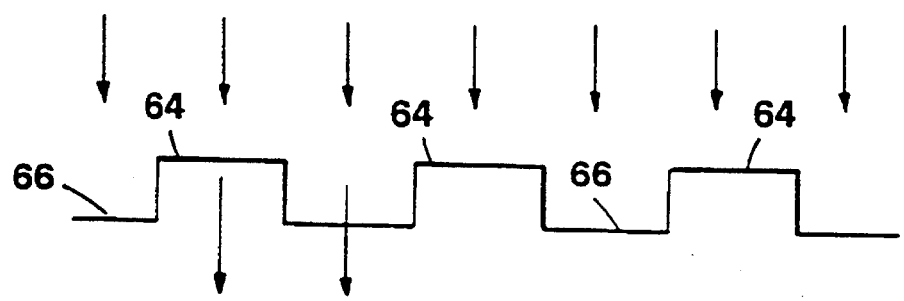
FIG. 4 is a diagrammatic view, taken along the line 4—4 of FIG. 3, showing aspects of the binary illuminator optics employed in the system shown in FIG. 1.
Figure 5:
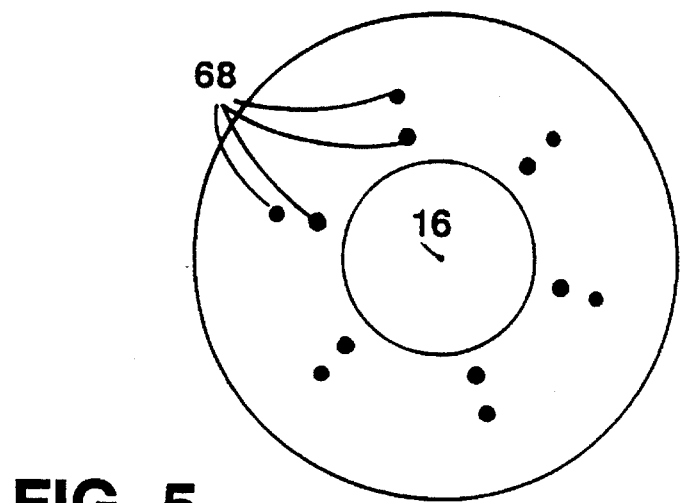
FIG. 5 is a diagram of the pupil fill of the binary illuminator shown in FIG. 3.

Further aspects of the illuminator optics 18 may be seen with reference to FIG. 3. A diagrammatic front view of a portion of the binary optics plate 56 is shown in FIG. 3. Formed in its surface is an array of regions 66 of triangular configuration in hexagon arrangement, etched portions 66 being offset in recessed manner (FIG. 4) from the planar surface triangular portions 64 to provide a first set of regions 64 of normal transmission and a second set of regions 66 where the radiation undergoes 180° phase shift upon transmission. Because all of the areas 64, 66 are transparent, this binary optic grating transmits nearly 100 percent of the incident radiation in a plurality of diffraction orders with essentially no radiation being transmitted "straight through" in the "zero order". The two-dimensional pattern of regions 64, 66 enables the illuminator module 18 to transmit most of the incident light so that the transmitted light illuminates regions within the locus of acceptance angles of the mirror system. The hexagonal pattern grating produces diffraction of transmitted radiation in twelve different directions 68 as indicated diagrammatically in FIG. 5 while a square checkerboard grating pattern would deliver most of the light in four different directions.

While a particular embodiment of the invention has been shown and described, various modifications will be apparent to those skilled in the art. For example, while an excimer laser has been described in the UV radiation source, other sources of UV radiation may be used, such as a deep UV lamp. Therefore, it is not intended that the invention be limited to the disclosed embodiment, or to details thereof, and departures may be made therefrom within the spirit and scope of the invention.

What is claimed is:

1. A high resolution, deep UV beam delivery system for exposing a surface, directly or through a mask, for purposes such as photolithography, surface cleaning, microstructuring, pattern micro imaging, or surface modification, said delivery system comprising a deep UV radiation source for generating a beam of deep ulraviolet radiation along a path, a first optical system in said path for homogenizing and shaping the deep UV energy in said path, said homogenizing optical system including a binary optic plate with a first set of regions of normal transmission and a second set of regions where the UV radiation undergoes a 180° phase shift upon transmission; and a second optical system in said path for directing radiation energy onto the surface of a substrate to be processed, said second optical system including large area mirror structure having a numerical aperture of at least 0.3 and a modular compensation assembly of refractive elements disposed between said large area mirror structure and said substrate and corresponding to the wavelength of said radiation source for compensating (reducing) image curvature introduced into the system by said large area mirror structure.

2. The system of claim 1 wherein all of the refractive elements in said second optical system are in said modular assembly.

3. The system of claim 1 wherein all of the refractive elements in said second optical system are of fused silica.

4. The system of claim 1 wherein said deep UV radiation source is a laser of wavelength in the 150–250 nanometer range.

5. The system of claim 1 wherein said binary optic plate has first and second sets of triangular regions arranged in a hexagonal checkerboard pattern.

6. The system of claim 1 wherein said large area mirror structure includes a first mirror with a convex spherical surface that is disposed on the system axis and obscures a portion of said beam path and a second mirror of concave spherical configuration with an aperture portion disposed on said beam path for passing a beam of radiation to said first mirror.

7. The system of claim 6 wherein said modular compensation assembly provides field flattening improvement of at least five times and includes a field flattening lens with curvature of at least five times the curvature of said convex mirror.

8. A high resolution, deep UV beam delivery system for exposing a surface, directly or through a mask, for purposes such as photolithography, surface cleaning, microstructuring, pattern microimaging, or surface modification, said delivery system comprising a deep UV radiation source for generating a beam of deep ultraviolet radiation along a path, a first optical system in said path for homogenizing and shaping the deep UV energy in said path; and a second optical system in said path for directing radiation energy onto the surface of a substrate to be processed, said second optical system including large area mirror structure having a numerical aperture of at least 0.3 and a modular compensation assembly of refractive elements disposed between said large area mirror structure and said substrate and corresponding to the wavelength of said radiation source for compensating (reducing) image curvature introduced into the system by said large area mirror structure, said modular compensation assembly being removable and having a cluster of four refractive elements designed for a particular wavelength.

9. A high resolution, deep UV beam delivery system for exposing a surface, directly or through a mask, for purposes such as photolithography, surface cleaning, microstructuring, pattern microimaging, or surface modification, said delivery system comprising a deep UV radiation source for generating a beam of deep ultraviolet radiation along a path, a first optical system in said path for homogenizing and shaping the deep UV energy in said path; and a second optical system in said path for directing radiation energy onto the surface of a substrate to be processed, said second optical system including large area mirror structure having a numerical aperture of at least 0.3 and a modular compensation assembly of refractive elements disposed between said large area mirror structure and said substrate and corresponding to the wavelength of said radiation source for compensating (reducing) image curvature introduced into the system by said large area mirror structure, said modular compensation assembly including a series of elements with the following dimensional values:

| Radius (Millimeters) | Spacing (Millimeters) |
| --- | --- |
| 69.21 | 4.86 |
| 27.82 | 3.47 |
| 28.40 | 9.00 |
| 69.00 | 0.50 |
| 17.00 | 12.66 |
| 6.54 | 5.66 |
| 208.12 | 6.39 |
| −70.54 | 3.10 |

10. A high resolution, deep UV beam delivery system for exposing a surface, directly or through a mask, for purposes such as photolithography, surface cleaning, microstructuring, pattern microimaging, or surface modification, said delivery system comprising a deep UV radiation source for generating a beam of deep ultraviolet radiation along a path, a first optical system in said path for homogenizing and shaping the deep UV energy in said path; said first optical system including a diverging lens and a converging lens to provide a shaped collimated beam of radiation for application to a fused silica plate member that has an array of first and second patterns that are offset from one another for enhancing pupil illumination, and subsequent to said plate member on the beam path a condenser lens for focusing the radiation passed by said plate in an image plane, and a second optical system in said path for directing radiation energy onto the surface of a substrate to be processed, said second optical system including large area mirror structure having a numerical aperture of at least 0.3 and a modular compensation assembly of refractive elements disposed between said large area mirror structure and said substrate and corresponding to the wavelength of said radiation source for compensating (reducing) image curvature introduced into the system by said large area mirror structure.

11. The system of claim 10 wherein said system is a microlithography system with a numerical aperture of at least 0.5.

12. The system of claim 10 and further including optics for allowing an operator to view the imaging process at a visible wavelength while substrate processing at a submicron wavelength is in progress.

13. Deep ultraviolet optical imaging system comprising:
a reflective imaging system comprising first and second spherical mirrors, at least fifty percent of the magnification or imaging power on the fast speed end of the system being provided by said mirrors, and
field flattening and aberration correcting structure including an array of lens elements, said array of lens elements all being formed from the same refractive material type and providing a focal point outside of said array of lens elements,
comprising a first lens element disposed at a first predetermined position along an optical path of said imaging system for providing optical aberration compensation,
a second lens element disposed at a second predetermined position along said optical path subsequent to said first lens element for providing field flattening compensation,
a third lens element for providing supplemental optical aberration compensation and a fourth lens element for providing supplemental field flattening compensation.

14. The system of claim 13 wherein said same refractive material type is fused silica.

15. The system of claim 13 and further including binary optical illuminator structure disposed along said optical path of said system for producing illumination for the refractive and reflective components of said imaging system.

16. Deep ultraviolet optical imaging system comprising:
a reflective imaging system comprising first and second spherical mirrors, at least fifty percent of the magnification or imaging power on the fast speed end of the system being provided by said mirrors, and
field flattening and aberration correcting structure including an array of lens elements, said array of lens elements all being formed from the same refractive material type and providing a focal point outside of said array of lens elements,
comprising a first lens element disposed at a first predetermined position along an optical path of said imaging system for providing optical aberration compensation,
a second lens element disposed at a second predetermined position along said optical path subsequent to said first lens element for providing field flattening compensation, and
binary optical illuminator structure disposed along said optical path of said system for producing illumination for the refractive and reflective components of said imaging system,
said binary optical illuminator comprising a sheet of fused silica with a pattern of uniformly offset regions etched on its surface to provide a multiplicity of diffracted radiation beams.

17. A modular compensation assembly of refractive elements for use in a high resolution, deep UV beam delivery system for exposing a surface, directly or through a mask, for purposes such as photolithography, or surface cleaning, microstructuring, pattern microimaging, surface modification, said delivery system comprising a deep UV radiation source for generating a beam of narrow wavelength deep ultraviolet radiation along a path, a first optical system in said path for homogenizing and shaping the deep UV energy in said path; and a second optical system in said path for directing radiation energy onto the surface of a substrate to be processed, said second optical system including large area mirror structure having a numerical aperture of at least of 0.3, and a modular compensation assembly of refractive elements disposed between said large area mirror structure and said substrate and corresponding to the wavelength of said radiation source for compensating (reducing) image curvature introduced into the system by said large area mirror structure, said modular compensation assembly having the following dimensional values:

| Radius (Millimeters) | Spacing (Millimeters) |
| --- | --- |
| 69.21 | 4.86 |
| 27.82 | 3.47 |
| 28.40 | 9.00 |
| 69.00 | 0.50 |
| 17.00 | 12.66 |
| 6.54 | 5.66 |
| 208.12 | 6.39 |
| −70.54 | 3.10 |

18. The assembly of claim 17 wherein all of the refractive elements in said modular compensation assembly are of fused silica.

19. The assembly of claim 17 wherein said modular compensation assembly provides field flattening improvement of at least five times and includes a field flattening lens with curvature of at least five times the curvature of said convex mirror.

* * * * *

UNITED STATES PATENT AND TRADEMARK OFFICE
CERTIFICATE OF CORRECTION

PATENT NO.   : 5,559,338

DATED        : September 24, 1996

INVENTOR(S)  : David J. Elliott et al.

It is certified that error appears in the above-identified patent and that said Letters Patent is hereby corrected as shown below:

On the title page, item [56],
In the References Cited section, "Ichihare" should be --Ichihara--.

Col. 1, line 22, "(5XxYAG)" should be --(5xYAG)--.

Col. 3, line 33, "dryings" should be --drawings--.

Col. 4, line 30, col. 3, "4.66" should be --5.66--.

Col. 5, claim 1, line 19, "micro imaging" should be --microimaging--;

line 21, "ulraviolet" should be --ultraviolet--.

Signed and Sealed this

Fourth Day of February, 1997

Attest:

BRUCE LEHMAN

*Attesting Officer*            *Commissioner of Patents and Trademarks*